United States Patent
Takagi et al.

(10) Patent No.: US 11,177,133 B2
(45) Date of Patent: Nov. 16, 2021

(54) METHOD OF FILLING RECESS

(71) Applicant: TOKYO ELECTRON LIMITED, Tokyo (JP)

(72) Inventors: Satoshi Takagi, Nirasaki (JP); Yoshimasa Watanabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/690,958

(22) Filed: Nov. 21, 2019

(65) Prior Publication Data

US 2020/0161135 A1    May 21, 2020

(30) Foreign Application Priority Data

Nov. 21, 2018   (JP) .............................. JP2018-218602

(51) Int. Cl.
*H01L 21/02* (2006.01)
*H01L 21/268* (2006.01)

(52) U.S. Cl.
CPC ...... *H01L 21/268* (2013.01); *H01L 21/02532* (2013.01); *H01L 21/02656* (2013.01)

(58) Field of Classification Search
CPC ............. H01L 21/268; H01L 21/02656; H01L 21/02532; H01L 21/32055; H01L 21/02381; H01L 21/02675; H01L 21/02664; H01L 21/76843; H01L 21/76864; H01L 21/205; H01L 21/263
USPC ........................................................ 438/795
See application file for complete search history.

(56) References Cited

U.S. PATENT DOCUMENTS

| | | | | |
|---|---|---|---|---|
| 6,149,984 A * | 11/2000 | Yamazaki | ........... | C23C 16/4405 118/600 |
| 6,438,458 B2 * | 8/2002 | Shimoike | ......... | G05B 19/41815 700/250 |
| 6,816,330 B2 * | 11/2004 | Ikeda | ..................... | B82Y 10/00 360/55 |
| 2002/0072252 A1 * | 6/2002 | Nakajima | ............. | H01L 21/268 438/795 |
| 2003/0139066 A1 * | 7/2003 | Kusumoto | .......... | H01L 21/0259 438/795 |
| 2003/0141505 A1 * | 7/2003 | Isobe | ...................... | H01L 27/12 257/66 |
| 2003/0218171 A1 * | 11/2003 | Isobe | ................... | H01L 27/148 257/64 |
| 2003/0219935 A1 * | 11/2003 | Miyairi | ..................... | C30B 1/00 438/166 |
| 2003/0228723 A1 * | 12/2003 | Yamazaki | ........... | H01L 21/2026 438/164 |
| 2005/0176221 A1 * | 8/2005 | Yamazaki | ........... | C23C 16/4401 438/507 |
| 2005/0233557 A1 * | 10/2005 | Tanaka | .............. | H01L 21/02672 438/486 |

(Continued)

FOREIGN PATENT DOCUMENTS

JP    5275369 A    10/1993

*Primary Examiner* — Sheikh Maruf
(74) *Attorney, Agent, or Firm* — Nath, Goldberg & Meyer; Jerald L. Meyer; Tanya E. Harkins

(57) ABSTRACT

A method of filling a recess according to one embodiment of the present disclosure comprises heating an amorphous semiconductor film without crystallizing the amorphous semiconductor film by radiating laser light to the amorphous semiconductor film embedded in the recess.

6 Claims, 8 Drawing Sheets

(56) References Cited

U.S. PATENT DOCUMENTS

| | | | |
|---|---|---|---|
| 2005/0272184 A1* | 12/2005 | Hiramatsu | H01L 29/66757 438/149 |
| 2006/0202269 A1* | 9/2006 | Suzuki | H01Q 9/27 257/347 |
| 2006/0260545 A1* | 11/2006 | Ramaswamy | C23C 16/56 118/719 |
| 2008/0169349 A1* | 7/2008 | Suzuki | H01L 27/1266 235/492 |
| 2010/0193792 A1* | 8/2010 | Miyajima | H01L 21/84 257/59 |
| 2011/0079780 A1* | 4/2011 | Yamayoshi | H01L 29/04 257/57 |
| 2011/0212596 A1* | 9/2011 | Shimomura | H01L 21/76254 438/458 |
| 2012/0068188 A1* | 3/2012 | Feigelson | H01L 21/26546 257/76 |
| 2013/0210242 A1* | 8/2013 | Shida | B23K 26/0622 438/795 |
| 2016/0233108 A1* | 8/2016 | Feigelson | H01L 21/26546 |
| 2019/0035629 A1* | 1/2019 | Mizumura | G03F 7/201 |
| 2019/0341261 A1* | 11/2019 | Feigelson | H01L 29/1608 |

* cited by examiner

METHOD OF FILLING RECESS

CROSS-REFERENCE TO RELATED APPLICATION

This application is based upon and claims the benefit of priority from Japanese Patent Application No. 2018-218602, filed on Nov. 21, 2018, the entire contents of which are incorporated herein by reference.

TECHNICAL FIELD

The present disclosure relates to a method of filling a recess.

BACKGROUND

A method of embedding an Al alloy layer in an opening formed in an insulating film on a semiconductor substrate has been known in which a first Al alloy layer is formed, the first Al alloy layer is caused to flow by radiating laser light, and then a second Al alloy layer is formed on the first Al alloy layer (see, for example, Patent Document 1).

PRIOR ART DOCUMENT

Patent Document

Patent Document 1: Japanese Laid-open Publication No. 5-275369

SUMMARY

A method of filling a recess according to one embodiment of the present disclosure comprises heating an amorphous semiconductor film without crystallizing the amorphous semiconductor film by radiating laser light to the amorphous semiconductor film embedded in the recess.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1A:
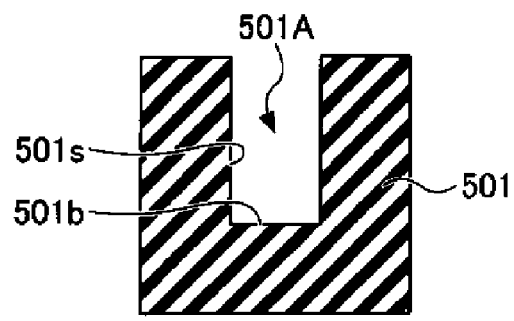
FIGS. 1A to 1E are cross-sectional views illustrating steps of an exemplary method of filling a recess.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant explanations will be omitted.

(Method of Filling Recess)

A method of filling a recess according to an embodiment will be described. The method of filling a recess according to an embodiment is a method in which an amorphous silicon film is embedded in a recess such as a hole or a trench by alternately repeating film formation and etching in the recess and then laser annealing is performed. The amorphous silicon film may be, for example, a non-doped film or a doped film. The dopant of the doped film may be, for example, phosphorus (P), boron (B), arsenic (As), oxygen (O), or carbon (C).

FIGS. 1A to 1E are cross-sectional views illustrating steps of an exemplary method of filling a recess. FIGS. 1A to 1E represent cross sections of the respective steps of the method of filling a recess.

First, a substrate (not illustrated) having an insulating film 501 having a recess 501A formed in the surface thereof is provided (see FIG. 1A). The substrate may be, for example, a semiconductor substrate such as a silicon substrate. The insulating film 501 may be, for example, a silicon oxide film ($SiO_2$ film) or a silicon nitride film (SiN film). The recess 102 may be, for example, a trench or a hole.

Figure 1B:
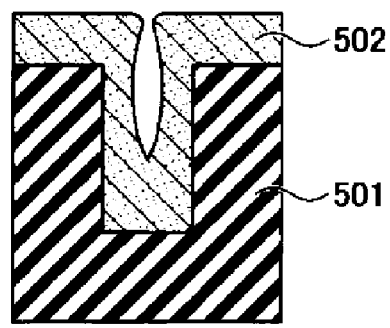

Subsequently, a film forming step is performed in which an amorphous silicon film 502 is formed in the recess 501A by supplying a silicon source gas to the substrate (see FIG. 1B). In an embodiment, by a chemical vapor deposition (CVD) method, for example, the silicon source gas is supplied in a state in which the substrate is heated so that the amorphous silicon film 502 is formed in the recess 501A. The film thickness of the amorphous silicon film 502 may be set such that, for example, the amorphous silicon film 502 is formed on a bottom surface 501$b$ and a side wall 501$s$ of the recess 501A and the opening in the upper portion of the recess 501A is not blocked by the amorphous silicon film 502. The silicon source gas is preferably a mixed gas of a halogen-containing silicon gas and a hydrogenated silane gas from the viewpoint that it is possible to form a film having an excellent step coverage and low surface roughness. The flow rate of the hydrogenated silane gas is preferably higher than the flow rate of the halogen-containing silicon gas. In this manner, it is possible to reduce the etching property of the silicon film by the halogen originating from the halogen-containing silicon gas, and to form the amorphous silicon film 502 at a high speed. The halogen-containing silicon gas may be, for example, a fluorine-containing silicon gas such as $SiF_4$, $SiHF_3$, $SiH_2F_2$, or $SiH_3F$, a chlorine-containing silicon gas such as $SiCl_4$, $SiHCl_3$, $SiH_2Cl_2$ (DCS), or $SiH_3Cl$, or a bromine-containing silicon gas such as $SiBr_4$, $SiHBr_3$, $SiH_2Br_2$, or $SiH_3Br$. The hydrogenated silane gas may be, for example, $SiH_4$, $Si_2H_6$, or $Si_3H_8$. In addition, before supplying the mixed gas of the halogen-containing silicon gas and the hydrogenated silane gas, a seed layer may be formed by supplying a higher-order silane-based gas or an aminosilane-based gas. By forming the seed layer in the recess 501A, it is possible to reduce the roughness of the amorphous silicon film 502 formed on the seed layer. The higher-order silane-based gas may be, for example, $Si_2H_6$, $S_3H_8$, or $Si_4H_{10}$. The aminosilane-based gas may be, for example, diisopropylamino silane (DIPAS), tri(dimethylamino)silane (3DMAS), or bis(tertiarybutylamino)silane (BTBAS).

Figure 1C:
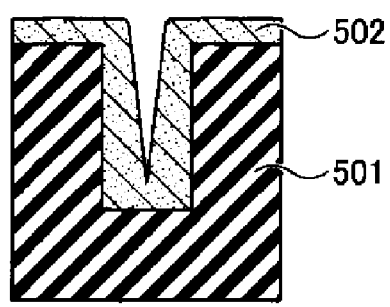

Subsequently, an etching step is performed in which part of the amorphous silicon film 502 formed in the recess 501A is etched by supplying a halogen-containing etching gas to the substrate (see FIG. 1C). As a result, the opening in the upper portion of the recess 501A is widened. The halogen-containing etching gas may be, for example, $Cl_2$, HCl, $F_2$, $Br_2$, or HBr, or may be a mixed gas thereof.

Figure 1D:
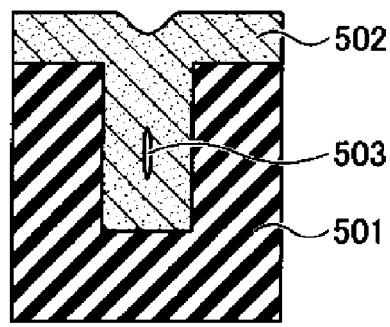

Subsequently, an embedding step is performed in which the amorphous silicon film 502 is embedded in the recess 501A by supplying a silicon source gas to the substrate (see FIG. 1D). In an embodiment, the amorphous silicon film 502 is formed such that the opening of the recess 501A is blocked through, for example, a chemical vapor deposition (CVD) method by supplying the silicon source gas in a state in which the substrate is heated. At this time, a void or a seam may be generated in the recess 501A in which the amorphous silicon film 502 is embedded. FIG. 1D represents the case in which a seam 503 is generated in the recess 501A. As the silicon source gas, it is preferable to use hydrogenated silane gas without using the halogen-containing silicon gas. As a result, because the amorphous silicon film 502 is not etched by the halogen originating from the halogen-containing silicon gas, it is possible to embed the amorphous silicon film 502 in the recess 501A in a short period of time.

Figure 1E:
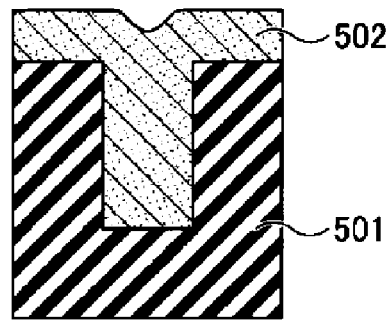

Subsequently, a laser annealing step is performed in which the amorphous silicon film 502 is heated without being crystallized by radiating laser light to the amorphous silicon film 502 embedded in the recess 501A (see FIG. 1E). In an embodiment, for example, the laser light is radiated while moving a position to which the laser light is radiated with respect to the recess 501A. At this time, the substrate temperature, the sweep speed (scanning speed), and the like are adjusted such that the amorphous silicon film 502 is not crystallized by radiating the laser light. The substrate temperature may be adjusted by changing the laser wavelength, laser output, and the like. In addition, for example, the laser light may be radiated while the position of the recess 501A is moved in a state in which the position to which the laser light is radiated is fixed. In the laser annealing step, it is possible to remove the seam 503 in the recess 501A without crystallizing the amorphous silicon film 502 embedded in the recess 501A. The reason that the seam 503 in the recess 501A can be removed will be described later.

As described above, according to the method of filling a recess according to the embodiment, the amorphous silicon film 502 is heated without being crystallized by radiating laser light to the amorphous silicon film 502 embedded in the recess 501A. Thus, it is possible to remove the seam 503 in the recess 501A without crystallizing the amorphous silicon film 502 embedded in the recess 501A. As a result, for example, when a part or all of the film embedded in the recess 501A is etched in a later step, the etching is facilitated because the amorphous silicon film 502 is not crystallized. Meanwhile, when the amorphous silicon film 502 embedded in the recess 501A is crystallized, it may be difficult to perform the etching.

In the above example, the case in which the cycle of the film forming step and the etching step is performed once has been described. However, the present disclosure is not limited thereto, and the above cycle may be repeated multiple times. The number of cycles may be determined depending on, for example, the shape of the recess 501A. For example, when it is difficult to embed a film in the recess 501A, for example, when the opening of the recess 501A is narrow and the recess 501A having a barrel-shaped cross section has a high aspect ratio, it is preferable to repeat the above cycle multiple times. This makes it possible to avoid the formation of a void in the recess 501A.

In the above example, the case in which the amorphous silicon film is formed has been described, but the present disclosure is not limited thereto. The method of filling a recess may be applied to a case in which, for example, an amorphous germanium film or an amorphous silicon germanium film is formed. Each of the amorphous germanium film and the amorphous silicon germanium film may be, for example, a non-doped film or a doped film.

In the case of forming an amorphous germanium film, for example, a germanium source gas may be used instead of the silicon source gas. In addition, a halogen-containing germanium gas, for example, may be used instead of the halogen-containing silicon gas. Further, a hydrogenated germane gas, for example, may be used instead of the hydrogenated silane gas. Furthermore, an aminogermane-based gas, for example, may be used instead of the aminosilane-based gas.

The halogen-containing germanium gas may be, for example, a fluorine-containing germanium gas such as $GeF_4$, $GeHF_3$, $GeH_2F_2$, or $GeH_3F$, a chlorine-containing germanium gas such as $GeCl_4$, $GeHCl_3$, $GeH_2Cl_2$, or $GeH_3Cl$, or a bromine-containing germanium gas such as $GeBr_4$, $GeHBr_3$, $GeH_2Br_2$, or $GeH_3Br$. The hydrogenated germane gas may be, for example, $GeH_4$, $Ge_2H_6$, or $Ge_3H_8$. The aminogermane-based gas may be, for example, dimethylamino germane (DMAG), diethylamino germane (DEAG), bis(dimethylamino)germane (BDMAG), bis(diethylamino)germane (BDEAG), or tri(dimethylamino)germane (3DMAG).

In the case of forming an amorphous silicon germanium film, a silicon source gas and a germanium source gas, for example, may be used instead of the silicon source gas. In addition, a halogen-containing silicon gas and a halogen-containing germanium gas, for example, may be used instead of the halogen-containing silicon gas. Further, a hydrogenated silane gas and a hydrogenated germane gas, for example, may be used instead of the hydrogenated silane gas. Furthermore, an aminosilane-based gas and an aminogermane-based gas, for example, may be used instead of the aminosilane-based gas.

(Film Forming Apparatus)

A film forming apparatus capable of carrying out the film forming step, the etching step, and the embedding step described above will be described by taking as an example a batch type vertical heat treatment apparatus that performs heat treatment collectively for a number of substrates. However, the film forming apparatus is not limited to a batch type apparatus, and may be, for example, a single wafer type apparatus that processes substrates one by one.

Figure 2:
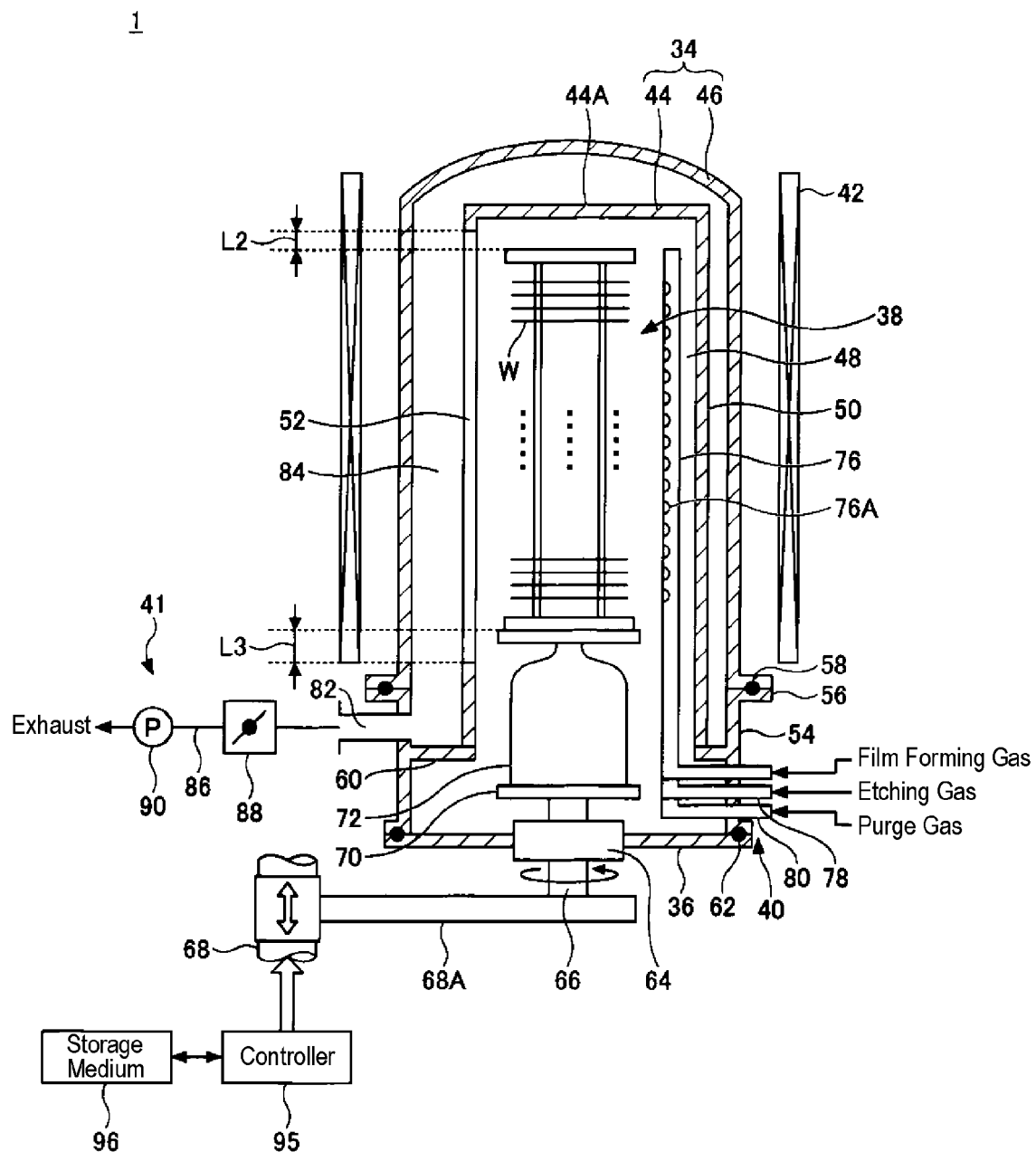
FIG. 2 is a vertical cross-sectional view illustrating an exemplary configuration of a vertical heat treatment apparatus.
Figure 3:
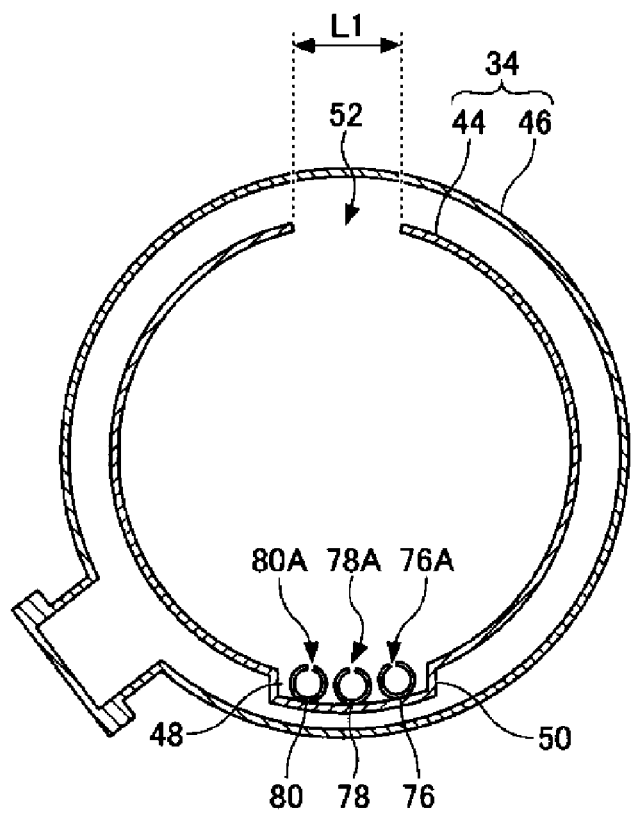
FIG. 3 is a view for explaining a reaction tube of the vertical heat treatment apparatus of FIG. 2.

FIG. 2 is a vertical cross-sectional view illustrating an exemplary configuration of a vertical heat treatment apparatus 1. FIG. 3 is a view for explaining a reaction tube of the vertical heat treatment apparatus 1 of FIG. 2.

As illustrated in FIG. 2, the vertical heat treatment apparatus 1 includes a reaction tube 34, a lid 36, a wafer boat 38, a gas supplier 40, an exhauster 41, and a heater 42.

The reaction tube 34 is a processing container that accommodates the wafer boat 38. The wafer boat 38 is a substrate holder that holds a number of semiconductor wafers (hereinafter, referred to as "wafers W") at predetermined intervals. The reaction tube 34 includes a cylindrical inner tube 44 having a ceiling and a lower open end, and a cylindrical outer tube 46 having a ceiling and a lower open end to cover the outside of the inner tube 44. The inner tube 44 and the outer tube 46 are formed of a heat-resistant material such as, for example, quartz, and are arranged coaxially to form a double-tube structure.

A ceiling part 44A of the inner tube 44 is, for example, flat. At one side of the inner tube 44 is formed a nozzle accommodation part 48 configured to accommodate a gas supply pipe along the longitudinal direction (vertical direction) thereof. For example, as illustrated in FIG. 3, a portion of the side wall of the inner tube 44 protrudes outwards so as to form a convex portion 50, and the inside of the convex portion 50 is formed as the nozzle accommodation part 48. In the side wall of the inner tube 44 opposite the nozzle accommodation part 48, a rectangular opening 52 having a width L1 is provided in the longitudinal direction (vertical direction) thereof.

The opening 52 is a gas exhaust port formed so as to be capable of exhausting the gas in the inner tube 44. The length of the opening 52 is formed to be equal to the length of the wafer boat 38 or to extend upwards and downwards in the vertical direction to be longer than the length of the wafer boat 38. That is, the upper end of the opening 52 extends to be located at a height equal to or higher than a position corresponding to the upper end of the wafer boat 38, and the lower end of the opening 52 extends to be located at a height equal to or lower than a position corresponding to the lower end of the wafer boat 38. Specifically, as illustrated in FIG. 2, the distance L2 in the height direction between the upper end of the wafer boat 38 and the upper end of the opening 52 is in the range of about 0 mm to 5 mm. In addition, the distance L3 in the height direction between the lower end of the wafer boat 38 and the lower end of the opening 52 is in the range of about 0 mm to 350 mm.

The lower end of the reaction tube 34 is supported by a cylindrical manifold 54 formed of, for example, stainless steel. A flange part 56 is formed at the upper end of the manifold 54, and the lower end of the outer tube 46 is installed and supported on the flange part 56. A seal member 58 such as an O-ring is interposed between the flange part 56 and the lower end of the outer tube 46 so that the inside of the outer tube 46 is hermetically sealed.

An annular support part 60 is provided on the inner wall of the upper portion of the manifold 54, and the lower end of the inner tube 44 is installed and supported on the support part 60. The lid 36 is hermetically installed on the opening in the lower end of the manifold 54 via a seal member 62 such as an O-ring so as to hermetically close the opening in the lower end of the reaction tube 34, that is, the opening in the manifold 54. The lid 36 is formed of, for example, stainless steel.

In the center of the lid 36, a rotary shaft 66 is provided through a magnetic fluid seal part 64. The lower part of the rotary shaft 66 is rotatably supported by an arm 68A of a lift part 68 configured as a boat elevator.

A rotary plate 70 is provided at the upper end of the rotary shaft 66, and the wafer boat 38 that holds the wafers W is placed on the rotary plate 70 via a quartz heat-insulating base 72. Therefore, by moving the lift part 68 up and down, the lid 36 and the wafer boat 38 move vertically as a unit, so that the wafer boat 38 can be inserted into and removed from the reaction tube 34.

The gas supplier 40 is provided in the manifold 54, and introduces gases such as a film forming gas, an etching gas, and a purge gas into the inner tube 44. The gas supplier 40 has a plurality of (e.g., three) quartz gas supply pipes 76, 78, and 80. Each of the gas supply pipes 76, 78, and 80 is provided within the inner tube 44 in the longitudinal direction thereof, and the base end thereof is bent in an L shape and penetrates the manifold 54 so as to be supported.

As illustrated in FIG. 3, the gas supply pipes 76, 78, and 80 are installed in the nozzle accommodation part 48 of the inner tube 44 in a row in the circumferential direction. A plurality of gas holes 76A, 78A, or 80A are formed at predetermined intervals in the longitudinal direction of each of the gas supply pipes 76, 78, and 80, so that a gas can be ejected horizontally from each of the gas holes 76A, 78A, and 80A. The predetermined intervals are set, for example, to be equal to the intervals of the wafers W supported in the wafer boat 38. The positions in the height direction are set such that each of the gas holes 76A, 78A, and 80A is located in the middle between vertically adjacent wafers W, so that each gas can be efficiently supplied to the spaces between the wafers W. As the types of gases, a film forming gas, an etching gas, and a purge gas are used, and each of the gases is adapted to be capable of being respectively supplied through the gas supply pies 76, 78, and 80, as necessary, while the flow rates thereof are controlled.

A gas outlet 82 is formed on the upper side wall of the manifold 54 and above the support part 60, and is adapted to be capable of discharging the gas within the inner tube 44. The gas is discharged from the opening 52 through the space 84 between the inner tube 44 and the outer tube 46. In the gas outlet 82, an exhauster 41 is provided. The exhauster 41 has an exhaust passage 86 connected to the gas outlet 82. A pressure regulation valve 88 and a vacuum pump 90 are sequentially provided in the exhaust passage 86 so as to be capable of evacuating the reaction tube 34.

On the outer circumferential side of the outer tube 46, a cylindrical heater 42 is provided so as to cover the outer tube 46. The heater 42 heats the wafers W accommodated in the reaction tube 34.

The overall operation of the vertical heat treatment apparatus 1 is controlled by a controller 95. The controller 95 may be, for example, a computer. A computer program that performs the overall operation of the vertical heat treatment apparatus 1 is stored in a storage medium 96. The storage medium 96 may be, for example, a flexible disk, a compact disk, a hard disk, a flash memory, or a DVD.

An exemplary method of embedding an amorphous semiconductor film in a recess formed in the surface of each wafer W by the vertical heat treatment apparatus 1 having related configurations will be described. First, the wafer boat 38 holding a number of wafers W is loaded into the reaction tube 34 by the lift part 68, and the opening in the lower end of the reaction tube 34 is hermetically closed and sealed by the lid 36. Subsequently, the controller 95 controls the operations of the gas supplier 40, the exhauster 41, the heater 42, and the like so as to execute the embedding step. In this manner, it is possible to embed the amorphous silicon film in the recess.

(Laser Annealing Apparatus)

Figure 4:
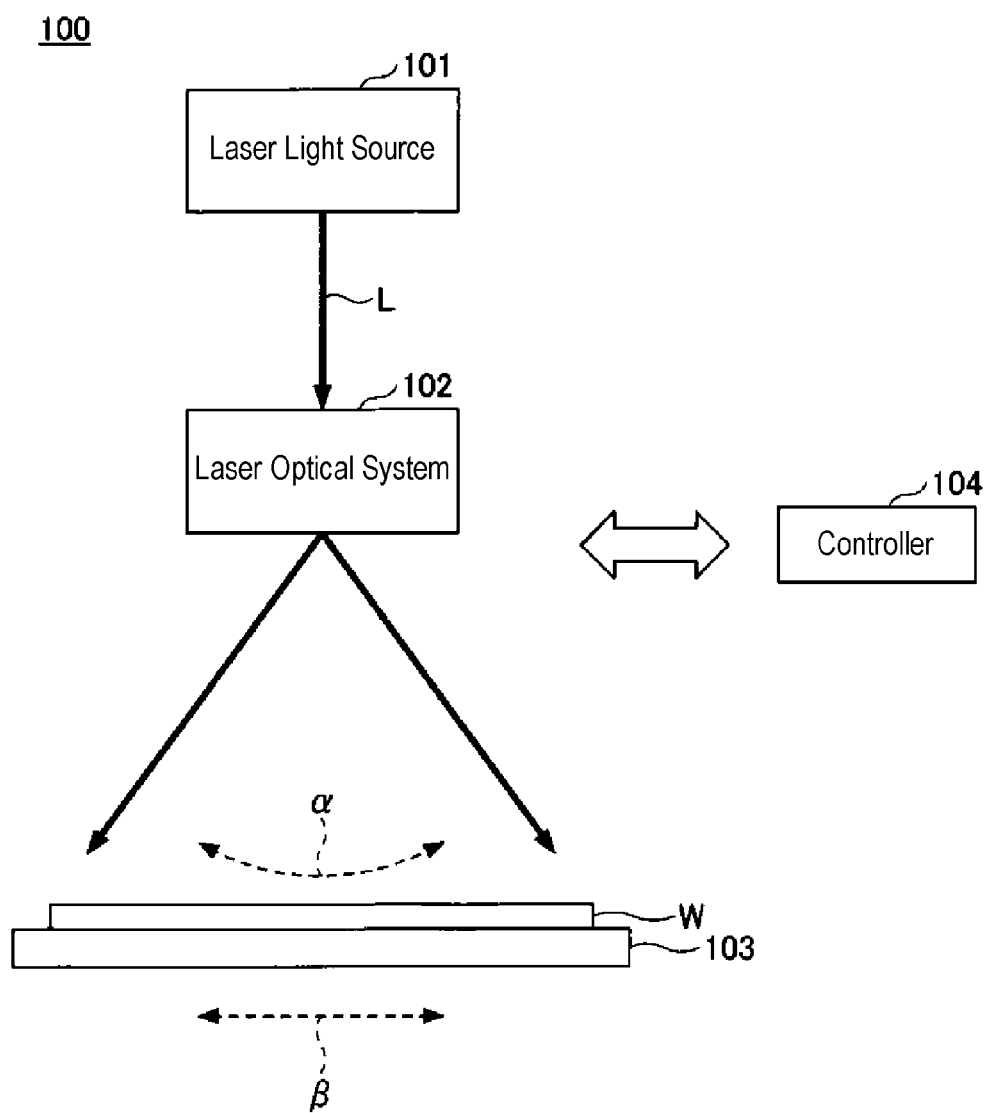
FIG. 4 is a schematic view illustrating an exemplary configuration of a laser annealing apparatus.

An exemplary laser annealing apparatus capable of performing the laser annealing step in the above-described method of filling a recess will be described. FIG. 4 is a schematic view illustrating an exemplary configuration of a laser annealing apparatus 100.

As illustrated in FIG. 4, the laser annealing apparatus 100 includes a laser light source 101, a laser optical system 102, a stage 103, and a controller 104. In the laser annealing apparatus 100, the laser beam L emitted from the laser light source 101 is incident on an annealing target wafer W placed on the stage 103 via the laser optical system 102. Hereinafter, each component of the laser annealing apparatus 100 will be specifically described.

The laser light source 101 emits the laser beam L towards the laser optical system 102. As the laser light source 101, for example, a fiber laser, a solid-state laser, or a gas laser may be used. As the wavelength of the laser beam L, for example, a range of 0.2 µm to 10 µm may be used.

The laser optical system 102 radiates the laser beam L emitted from the laser light source 101 to a wafer W placed on the stage 103. The laser optical system 102 includes a beam expander, a beam shaper, a slit, a condensing lens, a Galvano scanner, a beam profiler, and the like. The beam expander widens the beam diameter of the incident laser beam L. The beam shaper, the slit, and the condensing lens shape the beam cross-section on the surface of the wafer W into a predetermined shape, and make the light intensity distribution of the beam cross-section uniform. The Galvano scanner scans (sweeps) the incident laser beam L, and makes the incident laser beam L incident on the wafer W placed on the stage 103 (see arrow α in FIG. 4). As the sweep speed of the laser beam L, for example, a range of 0.1 mm/sec to 5,000 mm/sec may be used. The beam profiler measures the beam diameter, beam shape, beam position, power, intensity profile, and the like of the laser beam L incident on the wafer W.

The wafer W is placed on the stage 103. The stage 103 is controlled by the controller 104 and moves the wafer W in the horizontal direction (see arrow β in FIG. 4). As the moving speed of the stage 103, for example, a range of 0.1 mm/sec to 5,000 mm/sec may be used.

The controller 104 controls the operations of the laser light source 101, the laser optical system 102, and the stage 103. The controller 104 may be, for example, a computer. A computer program that performs the overall operation of the laser annealing apparatus 100 is stored in the storage medium 96. The storage medium may be, for example, a flexible disk, a compact disk, a hard disk, a flash memory, or a DVD.

An exemplary method of heating an amorphous semiconductor film formed in the recess in the surface of a wafer W without crystallizing the film by the laser annealing apparatus 100 will be described. First, a wafer W having an amorphous semiconductor film embedded in a recess is placed on the stage 103. Subsequently, the controller 104 controls the operations of the laser light source 101, the laser optical system 102, and the stage 103 so as to execute the heating step described above. In this manner, it is possible to remove a seam in the recess without crystallizing the amorphous silicon film embedded in the recess.

EXAMPLE

An example performed to confirm the effect of the method of filling a recess according to an embodiment will be described. In the example, after the amorphous silicon film was embedded in a recess using the vertical heat treatment apparatus 1, the laser annealing step was performed on the amorphous silicon film in the recess using the laser annealing apparatus 100.

Figure 5A:
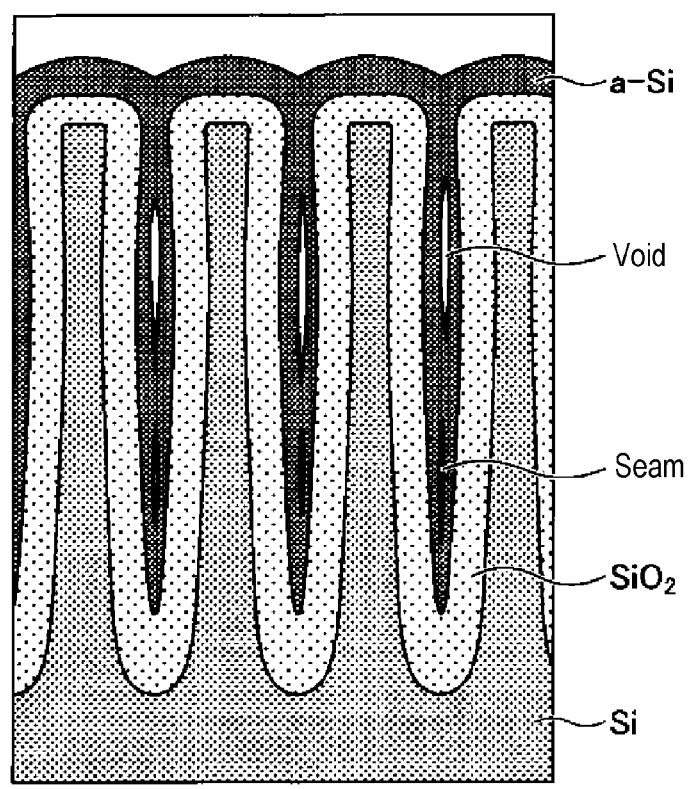
FIGS. 5A and 5B are views illustrating exemplary results before and after laser annealing treatment.
Figure 5B:
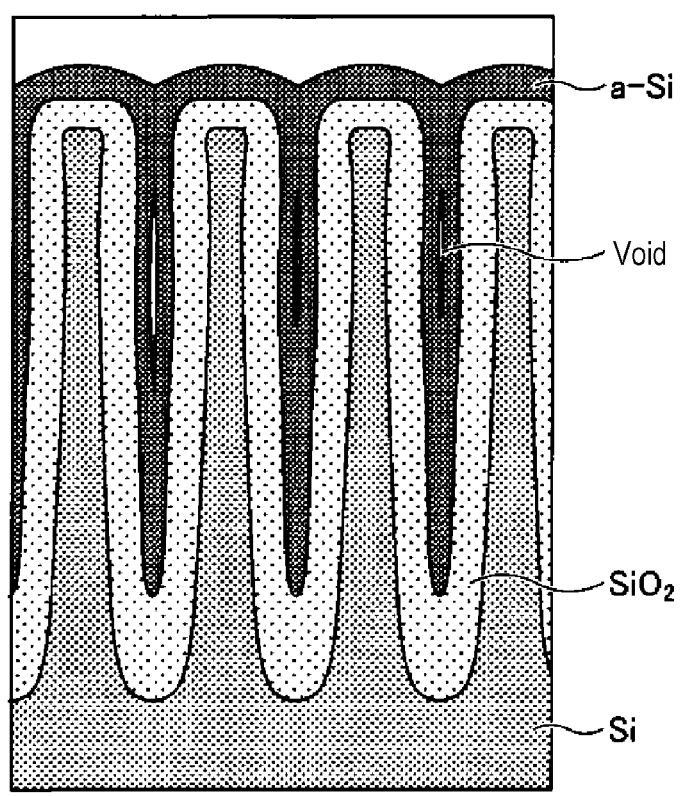

FIGS. 5A and 5B are views illustrating exemplary results before and after the laser annealing treatment. FIG. 5A illustrates the result before performing the laser annealing step, and FIG. 5B shows the result after performing the laser annealing step. The conditions for the laser annealing treatment are as follows.

<Conditions for Laser Annealing Treatment>
Laser wavelength: 1070 nm
Laser output: 43 W
Sweep speed: 5 mm/sec
Substrate temperature: 800 degrees C.

As illustrated in FIG. 5A, before performing the laser annealing step, voids and seams are generated in the recesses in which the amorphous silicon film is embedded. Meanwhile, as illustrated in FIG. 5B, after performing the laser annealing treatment, seams seen in the recesses are removed. From this, it is presumed that the amorphous silicon film in the portions to which the laser light is radiated expand slightly at a high temperature so that the seams in the recesses shrink and the dangling bonds are bonded to each other, thereby facilitating removal of the seams. In addition, as illustrated in FIG. 5B, after performing the laser annealing step, the voids seen in the recesses become smaller.

From the above results, it is considered that by performing the laser annealing treatment, it is possible to remove seams and small voids (e.g., those having a gap of less than 2 nm) without crystallizing the amorphous silicon film. In addition, it is considered that by performing the laser annealing treatment, it is possible to reduce large voids (e.g., those having a gap of 2 nm or more) without crystallizing the amorphous silicon film.

Next, the seam improvement effect when the temperature and the sweep speed were changed in the laser annealing treatment in the method of filling a recess according to the embodiment was evaluated.

Figure 6:
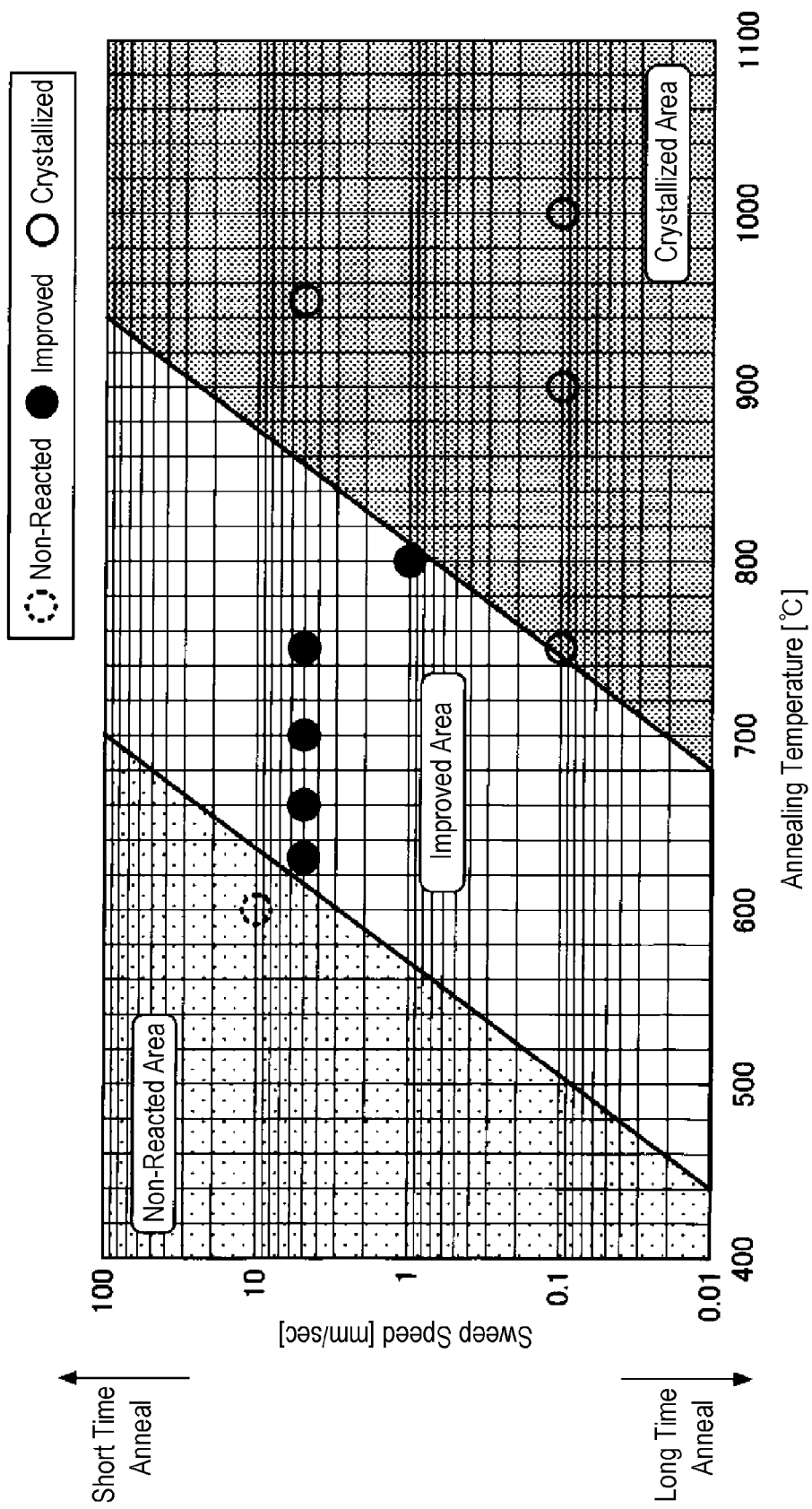
FIG. 6 is an explanatory view representing seam improvement effect when a temperature and a sweep speed are changed in laser annealing treatment.

FIG. 6 is an explanatory view representing a seam improvement effect when the temperature and the sweep rate were changed in the laser annealing step. In FIG. 6, the horizontal axis represents the annealing temperature (substrate temperature) [degrees C.], and the vertical axis represents the sweep speed [mm/sec]. In FIG. 6, the dotted circle indicates the result when disappearance of seams was not seen, the black circles indicate the results when disappearance of seams was seen, and the white circles indicate the results when disappearance of seams was seen but the amorphous silicon film was crystallized.

As shown in FIG. 6, for example, when the laser annealing treatment is performed on the amorphous silicon film such that the substrate temperature becomes 700 degrees C., it is possible to remove the seams without crystallizing the amorphous silicon film by setting the sweep speed to 0.02 to 100 mm/sec. In addition, for example, when the laser annealing treatment is performed on the amorphous silicon film such that the substrate temperature becomes 800 degrees C., it is possible to remove the seams in the recesses without crystallizing the amorphous silicon film by setting the sweep speed to 0.7 to 3000 mm/sec.

From the above, it is estimated that in the laser annealing treatment, it is possible to remove the seams in the recesses without crystallizing the amorphous semiconductor film by adjusting the substrate temperature and the sweep speed depending on the film type of the amorphous semiconductor film.

According to the present disclosure, it is possible to remove a seam generated when filling a recess with an amorphous semiconductor film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling a recess, comprising: heating an amorphous semiconductor film without crystallizing the amorphous semiconductor film by radiating laser light to the amorphous semiconductor film embedded in the recess, wherein heating the amorphous semiconductor film comprises adjusting a temperature of heating the amorphous semiconductor film and a moving speed of a position to which the laser light is radiated with respect to the amorphous semiconductor film based on a film type of the amorphous semiconductor film such that a seam formed in the recess is removed without crystallizing the amorphous semiconductor film embedded in the recess.

2. The method of claim 1, further comprising: embedding the amorphous semiconductor film in the recess by repeating forming the amorphous semiconductor film in the recess and etching a part of the amorphous semiconductor film.

3. The method of claim 2, wherein embedding the amorphous semiconductor film comprises forming the amorphous semiconductor film such that an opening of the recess is closed.

4. The method of claim 1, wherein heating the amorphous semiconductor film comprises radiating the laser light while a position to which the laser light is radiated is moved with respect to the recess.

5. The method of claim 1, wherein heating the amorphous semiconductor film comprises radiating the laser light while the recess is moved in a state in which a position to which the laser light is radiated is fixed.

6. The method of claim 1, wherein the amorphous semiconductor film is an amorphous silicon film, an amorphous silicon germanium film, or an amorphous germanium film.

* * * * *